United States Patent
Frew et al.

(10) Patent No.: US 10,298,247 B1
(45) Date of Patent: May 21, 2019

(54) MODULATORS

(71) Applicant: Cirrus Logic International Semiconductor Ltd., Edinburgh (GB)

(72) Inventors: Louis Frew, Glasgow (GB); Kapil Sharma, Edinburgh (GB); David Paul Singleton, Edinburgh (GB); Andrew James Howlett, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/919,985

(22) Filed: Mar. 13, 2018

(51) Int. Cl.
*H03K 7/08* (2006.01)
*H03M 1/06* (2006.01)

(52) U.S. Cl.
CPC .......... *H03M 1/0656* (2013.01); *H03K 7/08* (2013.01)

(58) Field of Classification Search
CPC ........ H03M 1/504; H03M 3/484; H03K 7/08; H03K 9/08
USPC .......................................... 341/118, 143, 155
See application file for complete search history.

(56) References Cited

U.S. PATENT DOCUMENTS

| | | | | |
|---|---|---|---|---|
| 5,770,940 A | * | 6/1998 | Goder | G05F 1/565 323/282 |
| 7,528,760 B2 | * | 5/2009 | Forejt | G04F 10/005 341/155 |
| 9,252,661 B2 | * | 2/2016 | Grbo | H02M 3/1588 |
| 9,425,813 B2 | * | 8/2016 | Lesso | H03M 1/18 |

* cited by examiner

*Primary Examiner* — Khai M Nguyen
(74) *Attorney, Agent, or Firm* — Jackson Walker L.L.P.

(57) ABSTRACT

This application relates to analog-to-digital converter (ADC) circuitry (200). A time-encoding modulator (TEM 201) has a comparator (104) and a loop filter (105) configured to generate a pulse-width-modulated (PWM) signal ($S_{PWM}$) in response to an input signal ($S_{IN}$) and a feedback signal ($S_{FB}$). A controlled oscillator, such as a VCO (202) receives the PWM signal and generates an output oscillation signal ($S_{OSC}$) with a frequency that varies based on a drive signal at a drive node (109), e.g. a drive node of a ring oscillator (107). The controlled oscillator (202) comprises at least one control switch (112) controlled by a switch control signal (S1) generated from the received PWM signal so as to control the drive strength of the drive signal applied to the drive node (109). The feedback signal ($S_{FB}$) for the TEM (201) is derived from the controlled oscillator (202) so as to include any timing error between the PWM signal and the switch control signal (S1) applied to said control switch.

19 Claims, 4 Drawing Sheets

US 10,298,247 B1

MODULATORS

FIELD

The field of representative embodiments of this disclosure relates to methods, apparatus and/or implementations concerning or relating to modulators for signal modulation, and especially to time-encoding modulators such as a modulators for generating pulse-width modulation signals.

BACKGROUND

Signal modulators are utilized in a number of applications, for instance as part of the conversion from analogue signals to digital signals or vice versa. Time-encoding modulators are modulators that encode input signals into a time-encoded data stream.

One particular form of time-encoding is pulse-width modulation (PWM). In a PWM signal, an input value is encoded by the duration of a given output signal level, e.g. the duration or width of pulse of a first signal level, compared to the duration of any period(s) of any other signal level(s) in a cycle period. For a conventional two-level PWM signal, the input signal value may be encoded by the duty cycle of a pulse of a first signal level within the cycle period, i.e. the proportion of the cycle period spent at the first output signal level.

One particular application of a time-encoding modulator is as part of an analogue-to-digital converter (ADC) having a controlled oscillator, such as a voltage-controlled-oscillator (VCO).

In a VCO based ADC the input analogue signal may be used to control the VCO, which thus outputs an oscillation signal with a frequency dependent on the value of the input signal. The frequency of the oscillation signal can be determined, for instance by counting the number of cycles of the oscillation signal in a defined frame period, to provide a digital output indicative of the value of the input signal. The VCO can be implemented by a relatively simple ring oscillator, which is relatively low power, and thus VCO based ADCs can be relatively efficient in terms of power requirements and circuit area compared to alternative ADC architectures such as continuous-time or discrete-time sigma-delta ADCs.

However VCOs, especially those based on ring oscillators, typically have relatively poor linearity. Thus if the VCO is controlled directly by the analogue input signal the resulting digital output signal may have poor linearity. Whilst this may be acceptable for some applications, the poor linearity is disadvantageous for many audio applications.

A time-encoding modulator, for instance a PWM modulator, can be used to improve the linearity of a VCO based ADC by modulating the input analogue signal into a time-encoded signal which varies between two voltage states, where the value of the input signal is encoded by the relative durations of each state. The time-encoded signal is then used to control the VCO. As the VCO thus only operates with two input voltage levels the output is inherently linear. The average frequency of the oscillation signal in a frame period depends on the proportion of time spent at each voltage level, and thus depends on the value of the input signal.

Especially for audio applications however there is an increasing requirement for better still audio performance, e.g. for low levels of distortion such as THD, and other sources of non-linearity associated with operation of the VCO may impact distortion performance.

EXAMPLE EMBODIMENTS OF THE PRESENT DISCLOSURE

Embodiments of the present disclosure relate to improved time-encoding modulators that at least mitigate at least some of these issues.

According to some embodiments there is provided an analogue to digital converter circuitry comprising:
- a time-encoding modulator comprising a comparator and a loop filter configured to generate a pulse-width-modulated (PWM) signal in response to an input signal and a feedback signal;
- a controlled oscillator configured to receive the pulse-width-modulated (PWM) signal and generate an output oscillation signal with a frequency that varies based on a drive signal at a drive node;
- wherein the controlled oscillator comprises at least one control switch configured to be controlled by a switch control signal generated from said received PWM signal so as to control a drive strength of the drive signal applied to the drive node;
- wherein the feedback signal for the time-encoding modulator is derived from the controlled oscillator so as to include any timing error between the PWM signal and the switch control signal applied to said control switch.

In some embodiments the feedback signal for the time-encoding modulator may be tapped from the switch control signal applied to said control switch. A buffer may be configured to receive a signal tapped from the switch control signal applied to said control switch and to output the feedback signal.

In some embodiments the feedback signal for the time-encoding modulator may be derived from the controlled oscillator so as to include an indication of any timing error between the drive signal applied to the drive node and the PWM signal. In such embodiments the feedback signal may thus be indicative of any timing error between the drive signal applied to the drive node and the PWM signal which arises due to timing errors in the switch control signal and possibly other timing errors associated with driving the drive node.

The circuitry may comprise a monitor for monitoring a signal level at a monitored node against a defined reference to provide the feedback signal, wherein the monitored node exhibits a variation in signal level with a duty cycle that corresponds to that of the drive node. In some instances the monitored node may be the drive node itself. In some embodiments however the monitored node may be some other node, for instance a replica drive node for driving a load in synchronism with the drive node. The monitor may comprise a comparator configured to compare the first signal against a reference voltage.

In some implementations the controlled oscillator may comprise a ring oscillator configured to be driven by a drive current signal at the drive node. A first current source may be configured to provide a first drive current to the drive node and the at least one control switch is controlled by said switch control signal to selectively connect a second current source to the to the drive node to provide a second drive current.

In some implementations the loop filter of the time-encoding modulator may be configured to filter the feedback signal to provide a filtered feedback signal. In some implementations the comparator may be configured to compare the input signal received at a first comparator input to the filtered feedback signal received at a second comparator input. In other implementations the filtered feedback signal may be combined with the input signal and applied to a first comparator input of the comparator. In which case the comparator may be configured to compare the signal at the first comparator input to a reference voltage. In some implementations the input signal may be applied to a first signal path of the time encoding modulator which is coupled to a first comparator input of the comparator. A reference voltage may be applied to a second signal path of the time encoding modulator, which coupled to a second comparator input of the comparator. The filtered feedback signal may be applied as a differential signal to both of the first and second signals paths.

In some implementations the loop filter may comprise first and second current sources controlled to source or sink current based on the feedback signal.

In some implementations the comparator may be a hysteretic comparator.

The analogue to digital converter circuitry may be implemented as an integrated circuit.

The analogue to digital converter circuitry may be configured to receive an analogue audio signal as said input signal. In some implementations an input node for receiving said input signal is coupled to a microphone node for receiving, in use, an analogue audio signal from a microphone.

Embodiments also relate to an electronic device comprising analogue to digital converter circuitry as discussed in any of the variants above. The electronic device may, in some instances, comprise a microphone transducer, wherein the analogue to digital converter circuitry is configured to receive a signal from the microphone transducer as the input signal. An electronic device including analogue to digital converter circuitry as discussed in any of the variants above device may be at least one of: a portable device; a battery powered device; an audio device; a communications device; a mobile or cellular telephone or a smartphone; a computing device; a notebook, laptop or tablet computing device; a gaming device; a wearable device; a smartwatch; a voice activated or voice controlled device; an electrical appliance.

In another aspect there is provided a time-encoding modulator circuit comprising:
  a time-encoding modulator configured to generate a time-encoded signal based on an input analogue signal and a feedback signal;
  a processing module configured to receive the time-encoded signal and generate at least one control signal based on the time-encoded signal, wherein in at least some operating conditions of the processing module the control signal may exhibit a timing error with respect to the time-encoded signal;
  wherein the feedback signal for the time-encoding modulator is derived from the downstream processing module such that the feedback signal includes the effect of any such timing error.

In another aspect there is provided a pulse-width-modulation (PWM) modulator comprising:
  a comparator configured to generate a PWM signal in response to an input signal and filtered feedback signal;
  an output node for outputting the PWM signal to a downstream processing module;
  a feedback node for receiving a feedback signal from the downstream processing module; and
  a loop filter configured to receive and filter the feedback signal from the feedback node and to generate said filtered feedback signal.

In another aspect there is provided analogue to digital converter circuitry comprising:
  a time-encoding modulator comprising a comparator and a loop filter configured to generate a pulse-width-modulated (PWM) signal in response to an input signal and a feedback signal;
  a controlled oscillator configured to receive the pulse-width-modulated (PWM) signal and generate an output oscillation signal with a frequency that varies based on a drive signal at a drive node;
  wherein the controlled oscillator comprises at least one control switch configured to be controlled by a switch control signal generated from said received PWM signal so as to control a drive strength of the drive signal applied to the drive node;
  wherein the feedback signal for the time-encoding modulator is derived from the controlled oscillator so as to include any delay between a signal transition of the PWM signal and a corresponding signal transition of the switch control signal applied to said control switch.

Unless expressly indicated to the contrary, any of the various features of the various implementations discussed herein may be implemented together with any one or more of the other described features in any suitable combination.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to time-encoding modulators (TEMs) and in particular to PWM (pulse-width modulation) modulators. Some embodiments also relate to signal processing circuits including such time-encoding modulators (TEMs), for example a controlled oscillator based ADC (analogue-to-digital converter). In embodiments of the present invention the time-encoded signal output from the TEM is used to generate at least one control signal for control of downstream components and a feedback signal for the TEM is derived that is representative of the timing of the control signal, e.g. tapped from a node to which the control signal is applied or otherwise responds to the control signal.

As described above one application of a time-encoding modulator, in particular a two-level PWM modulator, is an input stage for a controlled oscillator based ADC.

Figure 1:
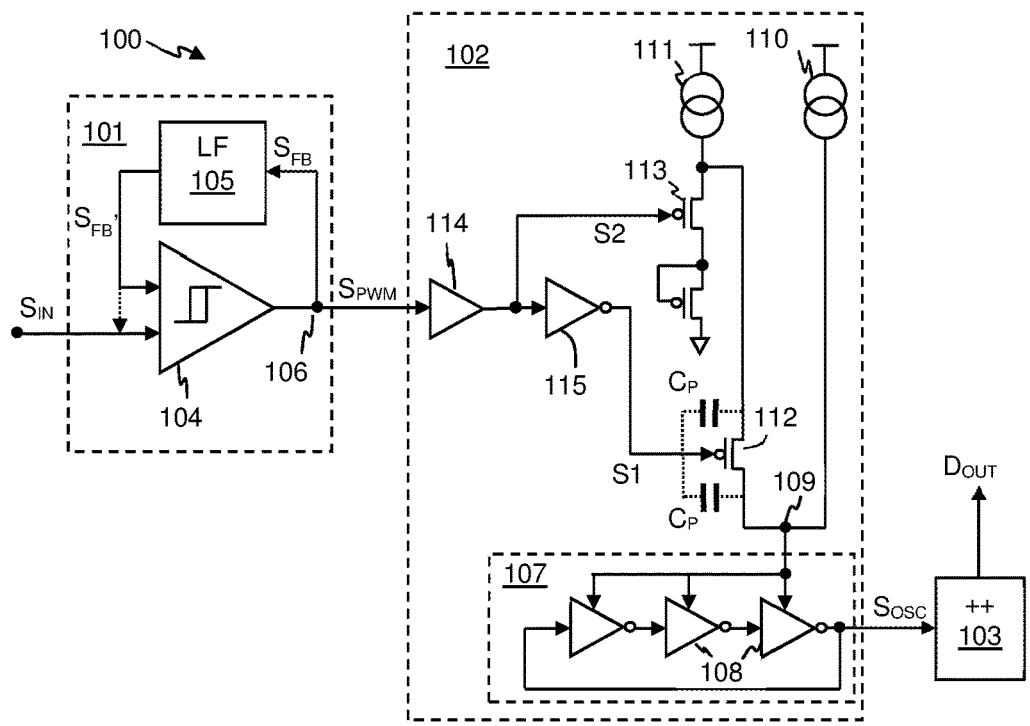
FIG. 1 illustrates one example of an ADC having a TEM and VCO.

FIG. 1 illustrates generally one example of an ADC 100 having a controlled oscillator driven by a TEM. FIG. 1 illustrates that an input signal $S_{IN}$ is received by the TEM 101, which in this instance is a PWM modulator for producing a two-level PWM signal $S_{PWM}$, with a duty cycle based on the input signal $S_{IN}$. The PWM signal $S_{PWM}$ is input to the controlled oscillator 102, which in this case is a VCO 102, which outputs an oscillation signal $S_{OSC}$ that has either a first frequency f1 or a second frequency f2 depending on the level of the PWM signal $S_{PWM}$. A downstream decoder, such as a counter 103 may be arranged to count the number pulses or signal transitions in the oscillation signal $S_{OSC}$, e.g. within a series of defined frame periods, to provide a digital output $D_{OUT}$ indicative of the value of the input signal $S_{IN}$.

The TEM 101 is arranged as a self-oscillating modulator having a comparator 104 and a loop filter 105. The comparator 104 may, for instance, be a hysteretic comparator, such as an op-amp comparator configured to provide hysteresis as will be understood by one skilled in the art. In the example illustrated in FIG. 1 the TEM 101 is arranged such that the input signal $S_{IN}$ is applied to a first comparator input of the hysteretic comparator 104 and a feedback signal $S_{FB}$, tapped from the output of the hysteretic comparator 104, is filtered by loop filter 105 and the filtered feedback signal $S_{FB}'$ is applied to a second comparator input of the hysteretic comparator 104. In such a case the loop filter 105 may comprise a passive low pass RC filter, although other filter arrangements may be implemented as will be described in more detail later. In some instances however the filtered feedback signal $S_{FB}'$ could be combined with the input signal $S_{IN}$, with the combined signal being applied to an input of the hysteretic comparator 104 and compared to a reference value (which may be expressly supplied to another comparator input of the hysteretic comparator 104 or defined by the structure of the hysteretic comparator 104). Such a TEM 101 can be implemented as a low size and low power PWM modulator and thus is advantageous in some applications. However other forms of TEM 101 may be used. For instance, in some implementations the TEM 101 may comprise a more conventional asynchronous sigma-delta modulator (ASDM). As will be understood by one skilled in the art, in a conventional ASDM the input signal $S_{IN}$ is typically combined with the feedback signal $S_{FB}$ and the combined input/feedback signal input to the loop filter 105 which comprises at least one integrator.

In any case, the feedback signal $S_{FB}$ is generally tapped from the output of the comparator 104, i.e. from a TEM feedback node 106 which receives the PWM signal $S_{PWM}$ output from the hysteretic comparator 104. The hysteretic comparator 104 is responsive to both the input signal $S_{IN}$ and the feedback signal $S_{FB}$ to generate the output PWM signal $S_{PWM}$ whose duty cycle varies with the level of the input signal $S_{IN}$. Thus the feedback signal $S_{FB}$ is tapped internally within the TEM 101 from the PWM signal $S_{PWM}$ which is output from the TEM 101.

The PWM signal $S_{PWM}$ output from the TEM 101 is supplied as an input to the VCO 102 for controlling switching of the VCO 102 to produce an oscillation signal $S_{OSC}$ as an output. In some implementations the VCO 102 comprises a ring oscillator 107, for example having a plurality of inverters 108 connected in series in a ring configuration with an output for providing the oscillation signal $S_{OSC}$. The drive strength of the inverters 108, and hence the propagation delay associated with each inverter, is controlled by a drive signal at a drive node 109. The received PWM signal $S_{PWM}$ is used to control switching of the drive node 109 between two different drive strengths.

In some embodiments the ring oscillator 107 may comprise a current-controlled oscillator (ICO) and the PWM signal $S_{PWM}$ is used to control switching of a drive current supplied to the drive node 109 so as to control the output oscillation signal $S_{OSC}$. For example the drive node 109 may be arranged to be continually driven by a first current source 110 and the PWM signal $S_{PWM}$ may be used to selectively control whether or not a second current source 111 contributes to the current at the drive node 109 depending on the state of the PWM signal $S_{PWM}$. At least a first control switch 112 may therefore be switched based on PWM signal $S_{PWM}$ to selectively connect the second current source 111 to the drive node. In the example illustrated in FIG. 1, a second control switch 113 is also switched in antiphase with the first control switch 112, so as to provide an alternative path for current from the second current source 111 when not being used to provide current to the drive node 109, e.g. to divert the current to ground. As illustrated in FIG. 1 the first and second control switches 112 and 113 may be driven by respective switch drivers, which in this example comprise a buffer/driver 114 and an inverter/driver 115 arranged to generate buffered control signals S1, S2 of appropriate polarity for driving the first and second control switches 112 and 113.

Thus depending on the state, e.g. high or low, of the received PWM signal $S_{PWM}$, the ICO ring oscillator 107 may be driven with a drive current from the first current source 110 only or with the combined drive current from the first current source 110 and the second current source 111. The current output from the second current source 111 may, in some implementations, be significantly higher than that from the first current source 110 so as to provide significantly different output frequencies for the two states of the received PWM signal $S_{PWM}$. The output oscillation signal $S_{OSC}$ generated by the ICO ring oscillator 107 may be output from the VCO 102 to counter 103. The counter 103 counts the number of oscillations of the oscillation signal $S_{OSC}$ in each of a succession of count periods and generates the digital output $D_{OUT}$ based on the count values.

Such an arrangement can provide a relatively low power and low size ADC circuit with good audio performance. The non-linearity of the ring oscillator 107, in terms of relationship between output frequency and drive current strength, is mitigated by driving the ring oscillator with just two drive current strengths, and controlling the average time spent at each frequency.

However there is an increasing demand for ever better distortion performance, especially for audio applications.

One addition source of possible error, and hence distortion, arises from non-linearity associated with operation of the first control switch 112 and/or second control switch 113. In the example illustrated in FIG. 1 the first and second control switches are driven by respective switch drivers 114 and 115 based on the PWM signal $S_{PWM}$. However the control switches have associated capacitance, for instance parasitic capacitances as represented by capacitances $C_P$ shown in FIG. 1 as illustrated with first control switch 112 (similar capacitances would also be associated with second control switch 113 but are omitted from FIG. 1 for clarity).

The effect of such capacitances may be to introduce timing errors between the PWM signal $S_{PWM}$ and the resultant switch control signal, e.g. S1, that is errors in the duty cycle of the switch control signal compared to the duty cycle of the PWM signal $S_{PWM}$. For instance, asymmetric drive strengths encountered in driving drive these switch capacitances high or low may result in a difference between the rising and falling edges of the gate voltages of the control switches. That is the slew-rate of the gate voltage of the control switches may be different when transitioning from low-to-high than when transitioning from high-to-low. This can, in effect, introduce a delay between a transition in the PWM signal output from the TEM 101 and the corresponding transition in the switch control signal where the delay varies for a high-to-low transition compared to a low-to-high transition. This can be seen as introducing an error into the duty cycle of the switch control signal as compared to the PWM signal $S_{PWM}$ or an error in the timing fidelity of the switch control signal.

Such timing errors in the switch control signals applied to the control switches can result in errors in the timing of application of the drive currents of different strengths to the drive node 109. This effect can thus result in a timing error with respect to the proportion of time that the drive node 109 is driven by the high strength drive current compared to the low strength drive current, which thus contributes to an error in the resultant frequency output, i.e. distortion. It will be appreciated that the extent of the error will vary as a function of the period of the PWM signal and thus the error can be seen as a signal dependent distortion.

Ideally the driver circuitry could be balanced to provide exactly equal propagation delays in each direction, but in practice it is impossible to maintain adequate balance for this purpose over normal variations in manufacturing tolerances, temperature, and supply voltage.

In embodiments of the present disclosure the feedback signal $S_{FB}$ for the TEM is indicative of at least some of such inevitable non-linear effects, i.e. the feedback signal may be representative of the timing of a downstream control signal derived from the PWM signal $S_{PWM}$ which may be affected by such non-linearity. Thus the effect of such non-linearity is included in the feedback loop for the TEM and taken into account when generating the PWM signal $S_{PWM}$. As a result the effect of the non-linearity is mitigated as the control loop for the TEM responds to the actual timing, i.e. duty-cycle, of the relevant control signal.

Figure 2:
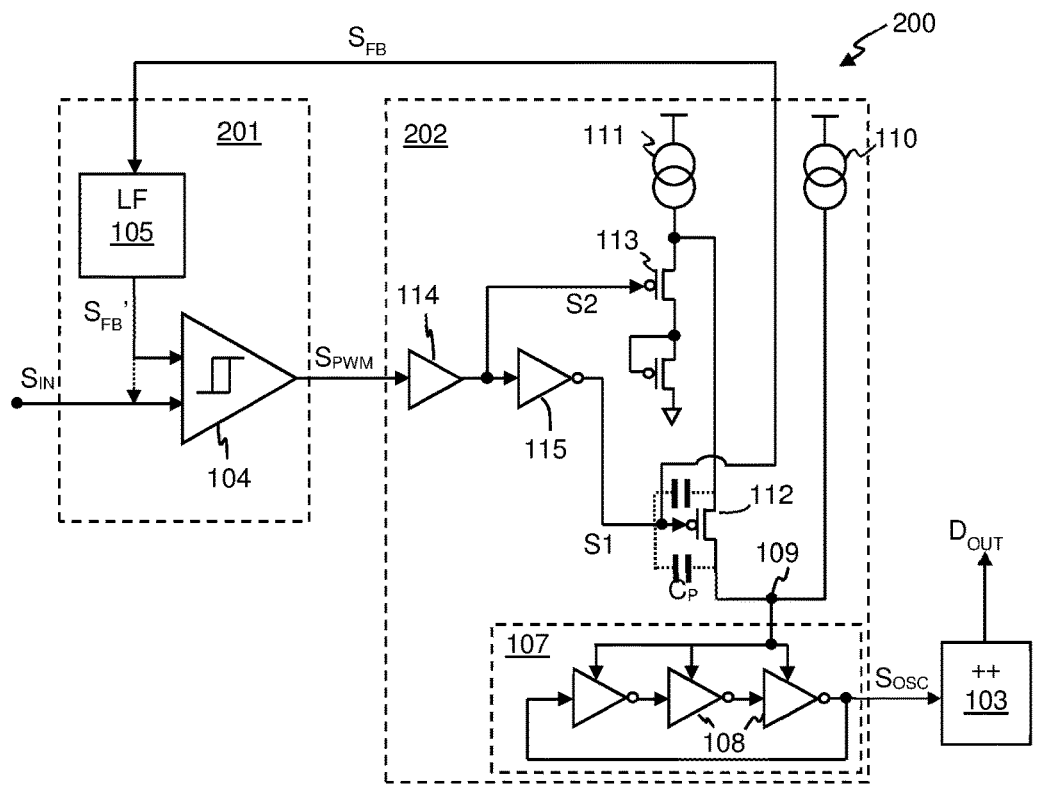
FIG. 2 illustrates an ADC having a TEM and VCO according to an embodiment.

FIG. 2 illustrates an ADC 200 according to an embodiment of the disclosure, in which similar components to those discussed with respect to FIG. 1 are identified by the same references. FIG. 2 again illustrates a TEM 201 arranged to receive an input signal $S_{IN}$ and generate a PWM signal $S_{PWM}$ for a controlled oscillator 202, in this case a VCO. As described above in this example the PWM signal $S_{PWM}$ is received by the VCO 202 and applied to successive switch drivers 114 and 115 to generate switch control signals S1 and S2 for controlling respective first and second control switches 112 and 113 so as to selectively couple current source 111 to the drive node 109 of ring oscillator 107.

In this embodiment however a feedback signal $S_{FB}$ for the TEM 201 is tapped from one of the switch control signals so as to include the impact of any non-linearity associated with driving the switch capacitances. In this example the feedback signal $S_{FB}$ is tapped from the control signal S1 applied to the first control switch 112. Tapping the feedback signal $S_{FB}$ from the control signal S1 provides an indication of the relevant timing of operation of switch S1, which controls when current source 111 is coupled to the drive node. This signal is thus indicative of a timing error that will exist at drive node 109. It should be noted however that the feedback signal could instead be tapped from the control signal S2 applied to the second control switch 113. Typically the first and second control switches 112 and 113 will be substantially the same design as one another and thus will have similar capacitances. The non-linearity associated with driving switch 113 will thus be substantially the same as that for switch 112 and thus either switch can be included within the feedback loop for the TEM 201 to enable such non-linearity to be compensated for, with suitable polarity matching such that the overall proportion of time spent in the two states of the feedback signal $S_{FB}$ is representative of the duty cycle at the drive node.

The feedback signal $S_{FB}$ is provided to the TEM 201. The TEM 201 may process the feedback signal $S_{FB}$ in the same manner as discussed above. For example as discussed in relation to FIG. 1 the feedback signal may be buffered as necessary and filtered by loop filter 105 and the filtered signal $S_{FB}'$ applied to one comparator input of the hysteretic comparator 104 whilst the input signal $S_{IN}$ is applied to another comparator input.

The embodiment illustrated in FIG. 2 thus includes the effect of non-linearity associated with driving the control switches 112 or 113. The switching of the hysteretic comparator 104 is thus controlled based on the actual timing of the switch control signal S1 or S2 and the feedback loop takes into account any non-linearity experienced in use which results in an error in fidelity of the duty-cycle of the switch control signal S1 or S2 compared to the PWM signal $S_{PWM}$. In embodiments of the present disclosure there will still be non-linear effects that result in fidelity errors between the relevant control signal, e.g. S1, and the PWM signal $S_{PWM}$, but the feedback ensures that the hysteretic comparator 104 of TEM 201 switches such that the duty cycle of switch control signal, e.g. S1, encodes the input signal $S_{IN}$ more accurately than otherwise would be the case for the example illustrated in FIG. 1. As such the oscillation signal $S_{OSC}$ output from the VCO 102 to counter 103 more accurately reflects the input signal $S_{IN}$. This can significantly improve the distortion performance of the ADC 200 compared with the approach illustrated in FIG. 1.

Figure 3:
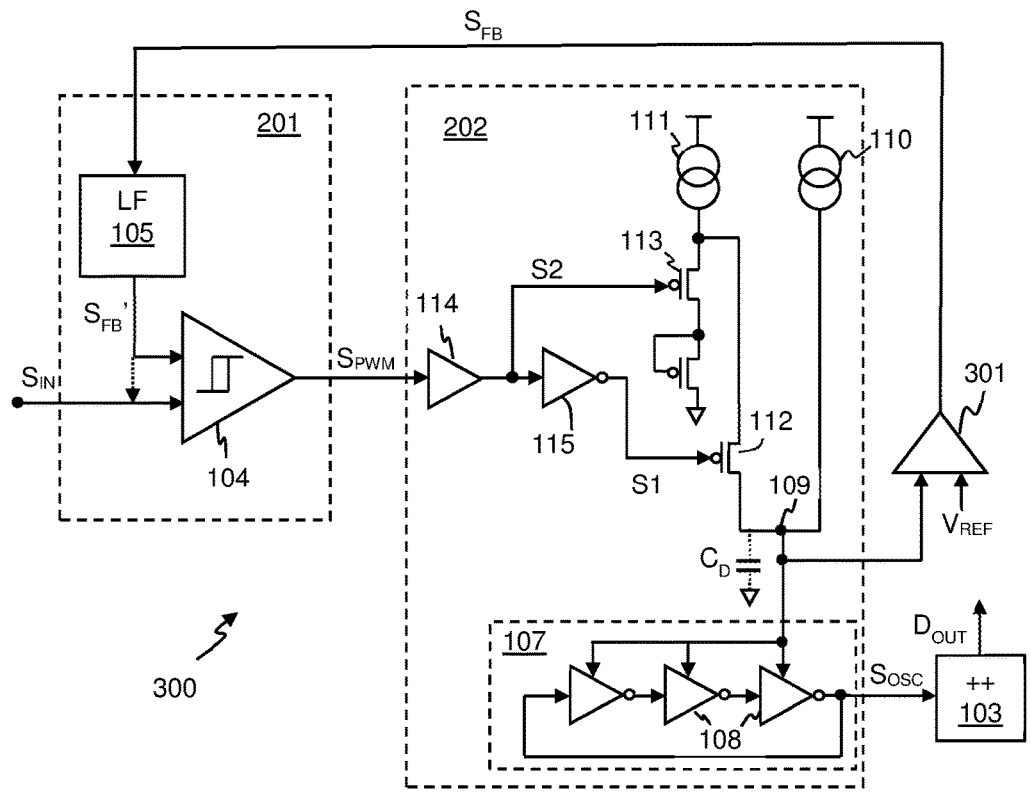
FIG. 3 illustrates a further embodiment of an ADC having a TEM and VCO.

A further possible source of error, and hence distortion, may arise due to a capacitance associated with the drive node 109. FIG. 3 illustrates that there may be a capacitance $C_D$ associated with the drive node. This capacitance $C_D$ may comprise a parasitic capacitance associated with the drive node 109, and/or some deliberately introduced capacitance to reduce the effect of any power supply noise feeding through to the controlled oscillator and causing jitter. In any case the capacitance $C_D$ associated with the drive node 109 can result in different rise and fall times, i.e. slew rates, associated with switching between the different drive strengths in a similar fashion as discussed above with respect to the drive voltages of the control switches. For example, when switching to the higher drive strength, the drive node 109 may exhibit a relatively fast rise time, but when switching back to the lower drive strength the fall time may be longer and the rise time versus the fall time as a function of the period of the PWM signal $S_{PWM}$ can vary with input signal. This represents another possible source of error in timing of the drive signal applied to the controlled oscillator 107, i.e. a duty-cycle error, and hence distortion in resulting output signal $D_{OUT}$.

To mitigate this issue, in some embodiments the feedback signal $S_{FB}$ may be derived so as to be indicative of the timing of the drive control signal applied to the drive node so as to include the effects on any capacitance associated with the drive node 109. FIG. 3 thus illustrates that a signal which is indicative of the drive signal at the drive node 109 may be tapped to provide the basis for the feedback signal $S_{FB}$.

In the embodiment illustrated in FIG. 3, the signal level, e.g. voltage at the drive node 109 may be monitored by a monitor 301. The monitor in this example comprises a comparator 301 for comparing the voltage at the drive node to a reference to act as a level detector. The reference may, in some instances, be a reference voltage chosen to correspond to an appropriate voltage between the expected voltages at the two different drive strengths (in steady state). The output of comparator 301 will be a two-level signal that indicates the timing at which the drive signal at the drive node 109 crosses the relevant threshold. This can be used as the feedback signal $S_{FB}$ for the TEM 201 and will include at least some of any duty-cycle timing error associated with the drive node 109, as well as any timing error associated with the control components for generating the drive signal, such as control switches 112 and 113. It will be appreciated that the monitor, i.e. comparator 301, may itself introduce some timing errors but, such errors may typically be less severe than the timing errors or loss of fidelity associated with the capacitance of the drive node 109, so that distortion performance is improved.

FIG. 3 illustrates that the drive node 109 itself may be monitored and compared to a reference by comparator 301. In some embodiments however it may be advantageous not to tap a signal from the ICO drive node 109 directly. For example in some embodiments there may be a load impedance or dummy ICO selectively driven by the current source 111 in synchronism with the drive node 109 (e.g. in phase with the drive node 109 or otherwise in synchronism such that the duty cycle of the monitored node is representative of the duty cycle of the drive node). Such an arrangement may have some advantages with regard to switching of the ICO 107 between the different drive strengths. A replica drive node for driving such load impedance or dummy ICO may therefore be monitored to provide an indication of the timing of the drive signal applied to the drive node 109. Such a replica drive node will experience similar timing errors to those in the duty cycle of the drive signal applied to the ICO 107, and thus such a monitored node, e.g. replica drive node, may be used to derive a suitable feedback signal.

Thus in general the feedback signal $S_{FB}$ may be generated or derived by monitoring the actual drive node used to drive the ICO 107 that provides the output oscillation signal. In some instances however the feedback signal $S_{FB}$ may be generated or derived by monitoring some other monitored node, say a replica node configured to provide load and drive conditions similar to the drive node so as to accurately follow the timing of transitions at the drive node.

It will be appreciated that the embodiments have been described above with an ICO as ring oscillator 107, and thus the drive signal corresponds to a drive current. The voltage at the drive node will however vary with the strength of the drive current and thus the signal level at the drive node can be monitored in this way.

In some embodiments the ring oscillator could be a ring oscillator which is driven by a voltage at the drive node, i.e. a VCO ring oscillator. Such a VCO ring oscillator may be driven by controlling control switches to couple a drive node to different defined voltages, and the control switches may suffer from similar non-linearity as discussed above. Such a VCO ring oscillator may additionally or alternatively comprises some sort of buffer to drive a filter capacitance or provide a supply current which may also suffer from an asymmetric rise and fall times that affect the resultant duty cycle of the oscillator. Embodiments thus may be implemented with any type of ring oscillator.

Embodiments of the present disclosure thus make use of a TEM to generate a time encoded signal, in particular a PWM signal, based on an input signal where the time encoded signal is output to be used by some downstream module to derive a control signal and there may be some timing error introduced between the PWM signal and the resulting control signal due to components of the downstream module that reduces the fidelity of the control signal, as compared to the PWM signal. In embodiments of the disclosure the TEM is responsive to the input signal and also a feedback signal to generate the time-encoded signal and the feedback signal is derived from the downstream control signal. In particular in some embodiments the downstream module may be a controlled oscillator such as a VCO and the relevant control signal may be a switch control signal for controlling switching of drive elements, such as current sources, of the VCO or the relevant control signal may be a drive signal applied to a drive node of a ring oscillator. Thus the effect of at least some timing or duty cycle fidelity errors between the time-encoded signal and relevant control signal are included in the feedback loop for the TEM, which mitigates the effect of such errors and thus improves distortion performance compared to deriving the feedback signal internally within the TEM, e.g. directly from the time-encoded signal.

As discussed above the TEM 201 may be any suitable TEM for generating the time-encoded signal, e.g. the PWM signal $S_{PWM}$, and may in particular be arranged in self-oscillating type topology, but with the feedback signal $S_{FB}$ being derived from a downstream control signal which may include duty-cycle timing errors as discussed above.

Figure 4:
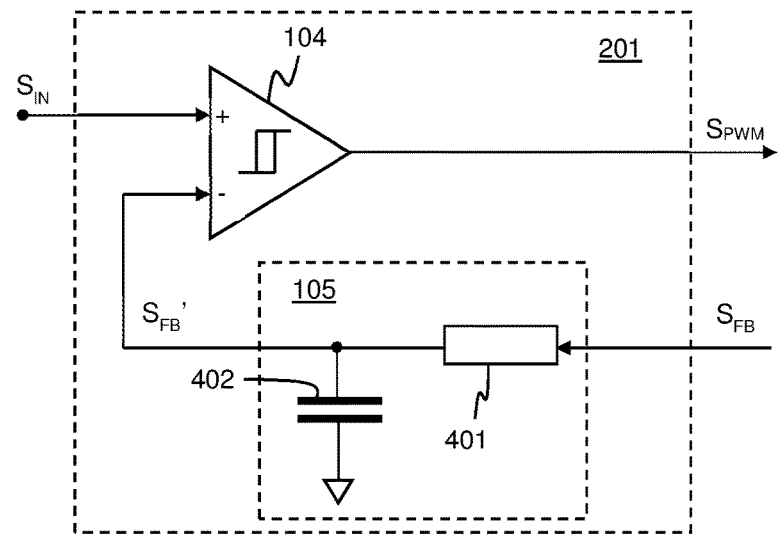
FIG. 4 illustrates one example of a suitable TEM.

FIG. 4 illustrates one example of a suitable TEM 201. As discussed previously the comparator 104 in this example compares the input signal $S_{IN}$ received at a first comparator input with a filtered feedback signal $S_{FB}'$ received at a second comparator input and generates a TEM output signal $S_{PWM}$ based on the comparison. The comparator in this example is a hysteretic comparator 104 that is operable to apply hysteresis to the comparison.

The hysteretic comparator 104 compares the signals at the first and second comparator inputs, i.e. the input signal $S_{IN}$ and the filtered feedback signal $S_{FB}'$, and outputs either of two output states, e.g. high and low states $V_H$ and $V_L$, depending on the result of the comparison. The hysteretic comparator 104 is operable to apply hysteresis to the comparison such that a differential voltage between the signals $S_{IN}$ and $S_{FB}'$ at the first and second comparator inputs must be greater (i.e. more positive or less negative) than a first threshold to transition from one output state to the other, say from output state $V_L$ to the output state $V_H$, but must be lower (i.e. less positive or more negative) than a second, different threshold to make the opposite transition, e.g. to swap from the output state $V_H$ to the output state $V_L$. The difference between these first and second thresholds corresponds to the amount of hysteresis applied. In some implementations the first and second thresholds may be equal in magnitude and opposite in polarity, i.e. the difference between the input signal $S_{IN}$ and the filtered feedback signal $S_{FB}'$ must be greater than an amount +H to transition to one state, say $V_H$, and must be lower than −H to transition to the other state. In this instance the magnitude of H can be seen as a measure of the hysteresis applied by the hysteretic comparator 104.

The loop filter 105 provides some signal averaging over time. Thus when the feedback signal $S_{FB}$ transitions from low state to the high state (due to the PWM signal $S_{PWM}$ having gone high), the value of the filtered feedback signal $S_{FB}'$ will rise, i.e. become more positive, but over a period of time. If the input signal $S_{IN}$ is itself relatively constant over that period of time the difference between the input signal $S_{IN}$ and the filtered feedback signal $S_{FB}'$ will decrease, i.e. become less positive/more negative, until the relevant threshold is reached and the PWM signal $S_{PWM}$ transitions to the low output state. The feedback signal $S_{FB}$ will, in due course, also transition low and the value of the filtered feedback signal $S_{FB}'$ will start to decrease. The hysteretic comparator 104 will maintain the low state $V_L$ until the difference between the input signal $S_{IN}$ and the filtered feedback signal $S_{FB}'$ increases, i.e. becomes less negative/more positive, to the second threshold.

Thus if the input signal $S_{IN}$ maintains a relatively constant level the output of the hysteretic comparator 104 will continually cycle between the high and low output states $V_H$ and $V_L$. The time constant of the filter arrangement 105 may be chosen to be fast enough, with respect to the maximum expected rate of change of the input signal $S_{IN}$, such that the input signal $S_{IN}$ can be assumed to substantially constant over the course of a cycle. In such a case the time spent in each output state will depend on how long it takes for the filtered feedback signal $S_{FB}'$ to change by the amount defined by the hysteresis, e.g. from a value equal to $S_{IN}$–H to a value $S_{IN}$+H or vice versa. This will clearly depend on the amount of hysteresis and also the rate of change of the filtered feedback signal $S_{FB}'$. However the rate of change of the filtered feedback signal $S_{FB}'$ will depend on the difference between the then-current value of the filtered feedback signal $S_{FB}'$ (which in turn depends on the level of the input signal $S_{IN}$) and the value of the feedback signal $S_{FB}$ itself.

In the example illustrated in the FIG. 4 the loop filter 105 comprises a passive RC low pass filter comprising resistance 401 in the feedback path and capacitance 402 coupled between the feedback path and a reference voltage, e.g. ground. Whilst the filter 105 may be implemented using resistors and capacitors as illustrated, other RC components such as FET based resistances and/or capacitances may be used in some implementations.

The action of the feedback loop of the TEM 201 is to output the PWM signal $S_{PWM}$ in the high state $V_H$ so that the feedback signal $S_{FB}$ charges the capacitance 402 to a voltage equal to $S_{IN}$+H and then to swap to the low state $V_L$ until the capacitance 402 is discharged to a voltage equal to $S_{IN}$–H and so on. However the rate of charging and discharging of the capacitance 402 depends on the difference between the level of the feedback signal $S_{FB}$ and the present voltage of the capacitance 402. If the input signal is at a relatively high level, the value of the voltage of capacitance 402 will be relatively high. When the feedback signal $S_{FB}$ is at a high level there will be a relatively low voltage difference across resistance 401 and the capacitance will charge relatively slowly. However when the feedback signal $S_{FB}$ goes low the difference across resistance 401 will be relatively high and the capacitance 402 will discharge more rapidly. At a relatively high level of input signal $S_{IN}$ it will thus take longer to charge the capacitance 402 from $S_{IN}$–H to $S_{IN}$+H than it takes to discharge from $S_{IN}$+H to $S_{IN}$–H. Thus at higher levels of the input signal the PWM signal $S_{PWM}$ will spend a longer time in the high output state than the low output state. The reverse is true for low signal levels. For a signal at the midlevel voltage, which for audio signal may correspond to a zero magnitude input signal, the time taken to charge and discharge between the hysteresis thresholds will be the same, leading to the same duration of periods of the high output state and the low output state in a cycle.

The TEM 201 thus encodes the level of input signal $S_{IN}$ by the proportion of time spent in the high output state compared to the low output state, i.e. by the duty cycle of the PWM signal $S_{PWM}$.

FIG. 4 illustrates a simple first order RC filter, however second or higher order filters could be implemented in some arrangements.

Figure 5:
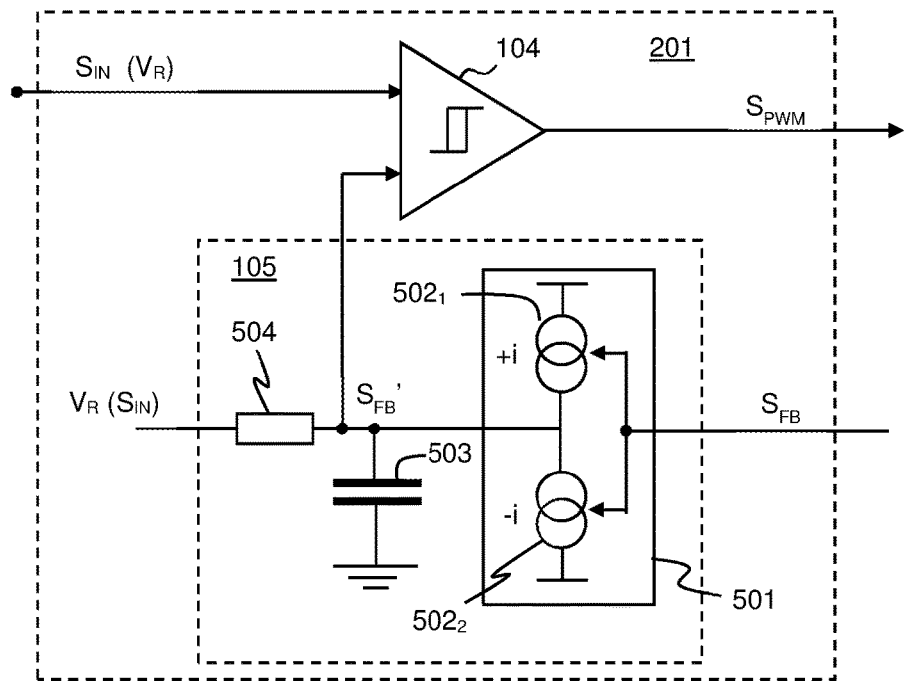
FIG. 5 illustrates another example of a suitable TEM.

FIG. 5 illustrates an alternative arrangement in which the loop filter arrangement 105 comprises a current generator 501 configured to generate a current signal having a current that varies depending on the state of the feedback signal $S_{FB}$. In the example illustrated in FIG. 5 the current generator comprises a first current source $502_1$ for generating a defined positive current +i and second current source $502_2$ for generating a defined negative current –i, i.e. the second current source $502_2$ acts as a current sink. The first and second current sources $502_1$ and $502_2$ are controlled to generate a positive or a negative current depending on the state of the feedback signal $S_{FB}$, that is the positive current +i is generated when the feedback signal $S_{FB}$ is in one state, e.g. high, and the negative current –i is generated when the feedback signal $S_{FB}$ is the other state, e.g. low. The current signal output from the current generator 501 is supplied to a node coupled to a feedback capacitor 503. The current signal thus charges or discharges the feedback capacitor 503 depending on its polarity.

To provide a variable rate of charging or discharging based on the value of the input signal in some embodiments the feedback capacitor may also be coupled via resistance 504 to a voltage source. In some embodiments the voltage source may be a defined reference voltage $V_R$, which may conveniently correspond to the voltage of the zero magnitude input signal, e.g. the midpoint voltage. The input signal $S_{IN}$ would then be provided as a separate input to the hysteretic comparator 104. In such an embodiment the rate of charging and discharging of the feedback capacitor 503 depends on the magnitude of the current produced by the current generator but also on the current through impedance 504, which in turn depends on the difference between the voltage of the feedback capacitor 503 (which as discussed above will correspond to the level of the input signal $S_{IN}$) and the reference voltage $V_R$. The voltage of the feedback capacitor thus provides the filtered feedback signal $S_{FB}'$ for hysteretic comparator 104.

Alternatively the input signal $S_{IN}$ could be applied to resistor 504 so as to contribute a charging or discharging current component that depends on the level of the input signal $S_{IN}$. In which case one input to the hysteretic comparator 104 is effectively a combined signal based on the filtered feedback signal $S_{FB}'$ and the input signal $S_{IN}$ which is compared to a reference voltage $V_R$, which may be expressly supplied to another comparator input or effectively defined by the structure of the hysteretic comparator 104.

As discussed the TEMs 201 described with reference to FIGS. 4 and 5 provide a PWM signal $S_{PWM}$ as an output of the TEM in which the value of the input signal is encoded as the duty cycle of the PWM signal, i.e. the proportion of time spent in one output state, say the high state $V_H$ compared to the other output state, say the low state $V_L$, or equivalently as a proportion of the cycle period. The encoding is similar in some respects to a conventional ASDM. As mentioned above for an input signal equal to a midlevel voltage, which for audio signals may correspond to a zero amplitude signal, the duty cycle will be 50%, i.e. within each cycle the duration spent at the high output state will be the same as the duration spent at the low output state. As the magnitude of the input signal increases, i.e. the value of input signal gets further away from the midlevel voltage, the duration of the period of one output state will increase and the duration of the period of the other output state will decrease, but not be the same amount. Thus the overall period of the PWM cycle will also vary with input signal. The shortest cycle period, and hence greatest PWM cycle frequency occurs when the signal is at a midlevel voltage, e.g. zero input signal magnitude, and this is referred to as the limit cycle frequency. As the magnitude of the input signal increases the PWM cycle frequency decreases. For instance at a signal magnitude of nine tenths of the maximum signal level, the PWM cycle frequency will be over five times lower than the limit cycle frequency. This relatively large variation in cycle frequency or period of the PWM signal $S_{PWM}$ may be disadvantageous in some implementations.

Figure 6:
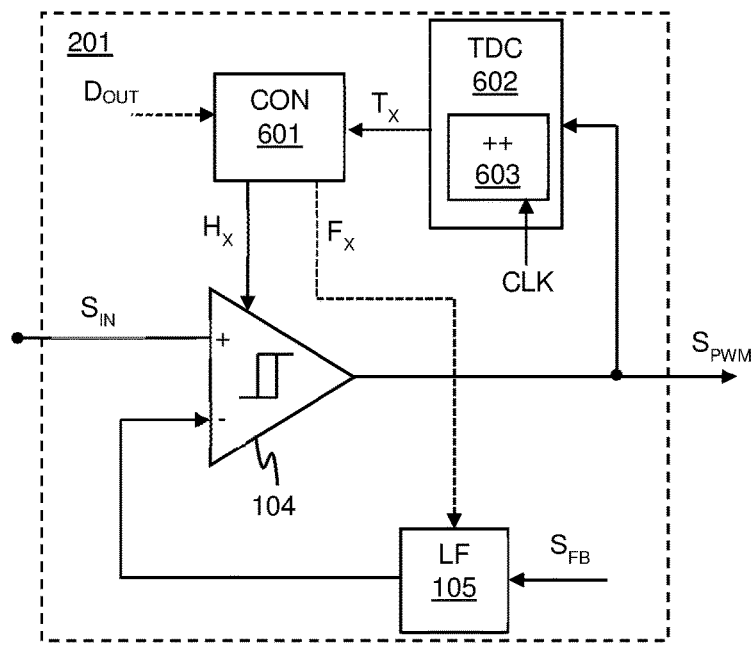
FIG. 6 illustrates a TEM with adaptive cycle frequency control.

To avoid these issues, FIG. 6 illustrates an embodiment where the TEM 201 includes a controller 601 for controlling the PWM cycle period (or equivalently PWM cycle frequency), for instance to maintain the PWM cycle period within defined limits. In some embodiments the cycle period controller 601 may be operative to apply adaptive hysteresis control, that is to control the amount of hysteresis applied by the hysteretic comparator 104 based on an indication of signal level of the input signal $S_{IN}$.

The amount of hysteresis applied has an impact on the cycle period, and hence frequency, as it determines the extent by which the filtered feedback signal $S_{FB}'$ (or combined filtered feedback signal/input signal) must vary in order to swap from one output state to the other. Reducing the amount of hysteresis applied will thus tend to decrease the PWM cycle period, and hence increase the PWM cycle frequency, and increasing the amount of hysteresis applied will have the opposite effect. The cycle period controller 601 may thus controllably vary a value $H_x$ of the hysteresis applied so as to reduce the amount of hysteresis applied as the magnitude of the input signal increases, so as to maintain the cycle period within a defined range. There are many ways the hysteresis applied by a hysteretic comparator 104 may be varied as will be understood by one skilled in the art.

Additionally or alternatively in some embodiments the cycle period controller 601 could control at least one parameter $F_x$ of the loop filter 105. For example where the loop filter 105 comprises a current generator 501 such as described with reference to FIG. 5, the current sources $502_1$ and $502_2$ could be configurable to provide a variable output current. The cycle period controller 601 may therefore control the output current from current sources $502_1$ and $502_2$ as the filter parameter $F_x$. A higher current will lead to a faster rate of change of the filtered feedback signal $S_{FB}'$ and hence a shorter cycle period and vice versa.

In some embodiments the digital output signal $D_{OUT}$ may be used as an indication of the level of the input signal $S_{IN}$. The cycle period controller 601 may therefore be configured to receive the digital output signal $D_{OUT}$ and to control the PWM cycle period, e.g. by varying the hysteresis $H_x$ and/or filter parameter $F_x$ applied, based on the value of the digital output signal $D_{OUT}$. In some embodiment however the TEM 201 may monitor the PWM signal $S_{PWM}$ and control the PWM cycle period based on the PWM signal.

The TEM 201 may therefore comprise a time-decoding-converter (TDC) 602 that receives a version of the PWM signal $S_{PWM}$ and determines a time parameter $T_x$ of the PWM signal $S_{PWM}$. The time parameter $T_x$ may be any parameter of the PWM signal $S_{PWM}$ that varies with input signal magnitude in a known way. In this example the time parameter $T_x$ may be the present cycle period T, although equally the time parameter could be the duration of a pulse of one output state or the duty cycle. This time parameter $T_x$ may thus be provided to cycle period controller 601.

For control of the PWM cycle period a relatively accurate or precise indication of the level of the input signal may not be needed and it may be sufficient to determine the cycle period T relatively crudely. The TDC 602 may, in some embodiments comprise a counter 603 which is clocked by a reference clock signal CLK. The counter 603 may be configured to determine at least one count value of the number of reference clock cycles in a period corresponding to the relevant time parameter, for instance the counter 603 may count the number of reference clock cycles in each period between successive rising edges in the PWM signal $S_{PWM}$ and provide the cycle-by-cycle count value as the measure $T_x$ of the cycle period T. As mentioned for the PWM cycle period control a high level of accuracy may not be needed and thus the reference clock signal CLK need only be fast enough to provide the required time resolution of the period or pulse length of the PWM signal.

In some instances control of the PWM cycle period may be performed during normal operation of the ADC. In some instances however the control of the PWM cycle period may be performed as an initial step on start-up of the ADC, e.g. as an initial calibration step for the present operating conditions. This initial step may set the hysteresis value $H_x$ and/or parameter $F_x$ of the loop filter 105 to values to set the limit-cycle period to a defined value or within a defined range, which values are then latched for subsequent operation.

The discussion above has focussed on receiving a single-ended input signal $S_{IN}$ which varies about some quiescent midlevel voltage reference, such as ground. Issues can arise however with any noise on the voltage reference, e.g. ground noise. One way to provide ground noise cancellation would be to use an inverting amplifier to produce an inverted version of the input signal and use the original input signal and the inverted version as components of a differential input signal. This does however require an additional inverting amplifier with the associated size and power requirements.

Figure 7:
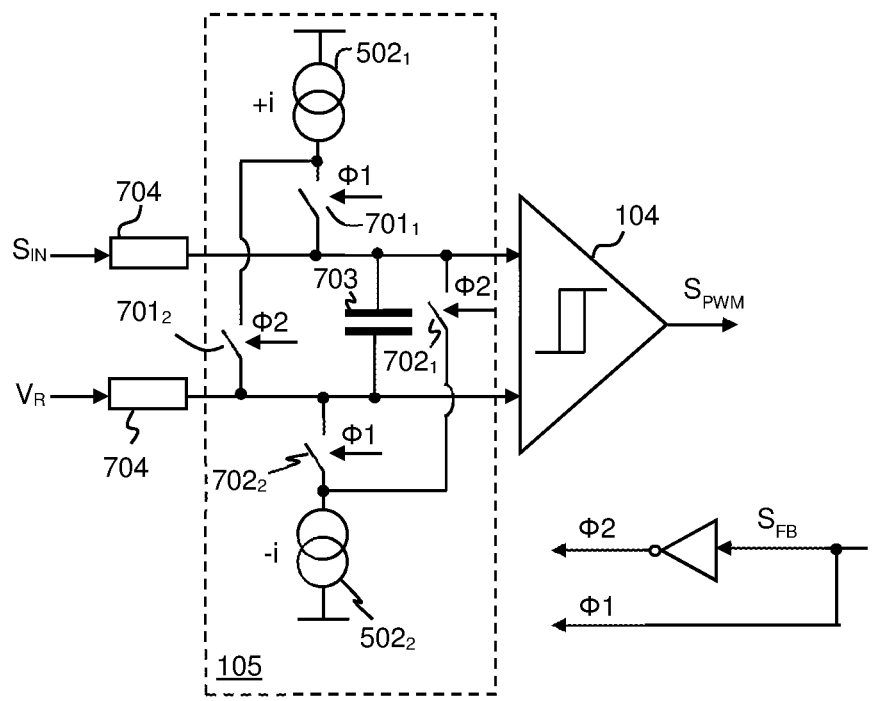
FIG. 7 illustrates a TEM with a pseudo-differential input.

FIG. 7 illustrates another embodiment of a TEM 201 which uses a pseudo-differential input arrangement to provide noise cancellation, e.g. ground noise cancellation, without requiring an initial inverting amplifier. In the embodiment of FIG. 7 the input signal $S_{IN}$ is received at a first signal path which leads to a first comparator input of the hysteretic comparator 104 and the relevant reference voltage $V_R$, e.g. ground, is applied to a second signal path that leads to a second input of the hysteretic comparator 104. The loop filter arrangement 105 comprises first and second current sources $502_1$ and $502_2$ for generating positive and negative currents, e.g. sourcing and sinking defined current, in a similar manner as described above in relation to FIG. 5. The current sources $502_1$ and $502_2$ are selectively coupled to the first signal path based on the state of the feedback signal $S_{FB}$. In the embodiment of FIG. 7 however the current sources $502_1$ and $502_2$ are also arranged to supply current to the second signal path, in antiphase. Thus switches $701_1$ and $701_2$ are arranged to couple the first current source $502_1$ to the first and second signal paths respectively and are configured to be switched in antiphase by control signals φ1 and φ2 generated from the feedback signal $S_{FB}$. Likewise switches $702_1$ and $702_2$ are arranged to couple the second current source $502_2$ to the first and second signal paths respectively and are also switched in antiphase by control signals φ2 and φ1 such that each of the first and second signal paths is connected to one of the first and second current sources $502_1$ and $502_2$. In effect the filtered feedback signal $S_{FB}'$ is thus applied to the first signal path with an inverted version of the filtered feedback signal $S_{FB}'$ being applied to the second signal path, i.e. the feedback is applied differentially to both inputs. A capacitor 703 is connected between the first and second signal paths and is charged and discharged by the feedback signals, but is also charged or discharged based on the difference between the input signal $S_{IN}$ and the reference $V_R$. As this embodiment uses current signals for the feedback the input signal $S_{IN}$ and the reference $V_R$ are applied to input resistors 704. Such an arrangement can provide good ground noise cancellation.

It will of course be understood that other designs of TEM are known and may be implemented in embodiments of the invention.

An ADC according to embodiments of the disclosure can thus provide good quality for audio applications and can be implemented in a relatively small circuit area and with relatively low power consumption. Embodiments have been described primarily with respect to ADCs and in general an ADC according to an embodiment may comprise a TEM configured to generate a PWM signal based on an input signal and a feedback signal and also a controlled oscillator for generating an oscillation signal with a frequency that varies depending on the strength of a drive signal at a drive node. The PWM signal generated by the TEM is received by the controlled oscillator and used control switching of at least one control switch so as to control the drive strength of a drive signal applied to a drive node of the controlled oscillator. The feedback signal for the TEM is derived from the controlled oscillator so as to include any duty-cycle timing error between the control signal applied to the control switch and the PWM signal.

However the same principles may be applied to other applications of a TEM where the time-encoded signal generated by the TEM is applied to a downstream component and used to generate a control signal in a way where the control signal may experience timing errors with respect to the time-encoded signal due to components of the downstream module.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Analogue to digital converter circuitry comprising:
a time-encoding modulator comprising a comparator and a loop filter configured to generate a pulse-width-modulated (PWM) signal in response to an input signal and a feedback signal;
a controlled oscillator configured to receive the pulse-width-modulated (PWM) signal and generate an output oscillation signal with a frequency that varies based on a drive signal at a drive node;
wherein the controlled oscillator comprises at least one control switch configured to be controlled by a switch control signal generated from said received PWM signal so as to control a drive strength of the drive signal applied to the drive node;
wherein the feedback signal for the time-encoding modulator is derived from the controlled oscillator so as to include any timing error between the PWM signal and the switch control signal applied to said control switch.

2. Analogue to digital converter circuitry as claimed in claim 1 wherein the feedback signal for the time-encoding modulator is tapped from the switch control signal applied to said control switch.

3. Analogue to digital converter circuitry as claimed in claim 2 comprising a buffer configured to receive a signal tapped from the switch control signal applied to said control switch and to output the feedback signal.

4. Analogue to digital converter circuitry as claimed in claim 1 wherein the feedback signal for the time-encoding modulator is derived from the controlled oscillator so as to include an indication of any timing error between the drive signal applied to the drive node and the PWM signal.

5. Analogue to digital converter circuitry as claimed in claim 4 comprising a monitor for monitoring a signal level at a monitored node against a defined reference to provide the feedback signal, wherein the monitored node exhibits a variation in signal level with a duty cycle that corresponds to that of the drive node.

6. Analogue to digital converter circuitry as claimed in claim 5 wherein the monitored node is the drive node.

7. Analogue to digital converter circuitry as claimed in claim 5 wherein the monitored node is a replica drive node for driving a load in synchronism with the drive node.

8. Analogue to digital converter circuitry as claimed in claim 5 wherein the monitor comprises a comparator configured to compare the first signal against a reference voltage.

9. Analogue to digital converter circuitry as claimed in claim 1 wherein the controlled oscillator comprises a ring oscillator configured to be driven by a drive current signal at the drive node.

10. Analogue to digital converter circuitry as claimed in claim 9 wherein a first current source is configured to provide a first drive current to the drive node and the at least one control switch is controlled by said switch control signal to selectively connect a second current source to the to the drive node to provide a second drive current.

11. Analogue to digital converter circuitry as claimed in claim 1 wherein the loop filter of the time-encoding modulator is configured to filter the feedback signal to provide a filtered feedback signal.

12. Analogue to digital converter circuitry as claimed in claim 11 wherein the comparator is configured to compare the input signal received at a first comparator input to the filtered feedback signal received at a second comparator input.

13. Analogue to digital converter circuitry as claimed in claim 11 wherein the filtered feedback signal is combined with the input signal and applied to a first comparator input of the comparator.

14. Analogue to digital converter circuitry as claimed in claim 13 wherein the comparator is configured to compare a signal at the first comparator input to a reference voltage.

15. Analogue to digital converter circuitry as claimed in claim 11 wherein the input signal is applied to a first signal path of the time encoding modulator coupled to a first comparator input of the comparator and a reference voltage is applied to a second signal path of the time encoding modulator coupled to a second comparator input of the comparator and wherein the filtered feedback signal is applied as a differential signal to both of the first and second signals paths.

16. Analogue to digital converter circuitry as claimed in claim 1 wherein the loop filter comprises first and second current sources controlled to source or sink current based on the feedback signal.

17. Analogue to digital converter circuitry as claimed in claim 1 wherein the comparator is a hysteretic comparator.

18. An electronic device comprising analogue to digital converter circuitry as claimed claim 1 wherein the device is at least one of: a portable device; a battery powered device; an audio device; a communications device; a mobile or cellular telephone or a smartphone; a computing device; a notebook, laptop or tablet computing device; a gaming device; a wearable device; a smartwatch; a voice activated or voice controlled device; an electrical appliance.

19. Analogue to digital converter circuitry comprising:
a time-encoding modulator comprising a comparator and a loop filter configured to generate a pulse-width-modulated (PWM) signal in response to an input signal and a feedback signal;
a controlled oscillator configured to receive the pulse-width-modulated (PWM) signal and generate an output oscillation signal with a frequency that varies based on a drive signal at a drive node;
wherein the controlled oscillator comprises at least one control switch configured to be controlled by a switch control signal generated from said received PWM signal so as to control a drive strength of the drive signal applied to the drive node;
wherein the feedback signal for the time-encoding modulator is derived from the controlled oscillator so as to include any delay between a signal transition of the PWM signal and a corresponding signal transition of the switch control signal applied to said control switch.

* * * * *